United States Patent
Diep et al.

(10) Patent No.: US 9,852,803 B2
(45) Date of Patent: Dec. 26, 2017

(54) DUMMY WORD LINE CONTROL SCHEME FOR NON-VOLATILE MEMORY

(71) Applicant: SANDISK TECHNOLOGIES INC., Plano, TX (US)

(72) Inventors: Vinh Quang Diep, San Jose, CA (US); Liang Pang, Fremont, CA (US); Ching-Huang Lu, Fremont, CA (US); Yingda Dong, Los Altos, CA (US)

(73) Assignee: SanDisk Technologies LLC, Plano, TX (US)

( * ) Notice: Subject to any disclaimer, the term of this patent is extended or adjusted under 35 U.S.C. 154(b) by 25 days.

(21) Appl. No.: 15/151,951

(22) Filed: May 11, 2016

(65) Prior Publication Data
US 2017/0330631 A1    Nov. 16, 2017

(51) Int. Cl.
| G11C 16/04 | (2006.01) |
| G11C 16/34 | (2006.01) |
| G11C 16/28 | (2006.01) |
| G11C 16/16 | (2006.01) |
| G11C 16/10 | (2006.01) |
| G11C 16/08 | (2006.01) |

(52) U.S. Cl.
CPC ......... *G11C 16/3431* (2013.01); *G11C 16/08* (2013.01); *G11C 16/10* (2013.01); *G11C 16/16* (2013.01); *G11C 16/28* (2013.01)

(58) Field of Classification Search
CPC ......... G11C 16/28; G11C 7/1006; G11C 7/14; G11C 7/062
USPC ........................................ 365/185.02, 189.07
See application file for complete search history.

(56) References Cited

U.S. PATENT DOCUMENTS

| 6,201,757 B1* | 3/2001 | Ward ................... G11C 7/1072 365/189.04 |
| 6,787,860 B1 | 9/2004 | Huang et al. |
| 7,057,958 B2 | 6/2006 | So |
| 7,535,764 B2 | 5/2009 | Chin |
| 9,230,676 B1 | 1/2016 | Pang |
| 9,299,450 B1 | 3/2016 | Sang |
| 9,583,198 B1* | 2/2017 | Pang ....................... G11C 16/10 |
| 2006/0158932 A1 | 7/2006 | Tamada |
| 2007/0011288 A1* | 1/2007 | Cases ..................... G06F 1/206 709/223 |
| 2011/0286274 A1* | 11/2011 | Chang ................ G11C 16/3418 365/185.17 |
| 2013/0272074 A1* | 10/2013 | Tanaka ............... G11C 16/3445 365/189.07 |
| 2013/0308380 A1 | 11/2013 | Kim |

OTHER PUBLICATIONS

International Search Report and Written Opinion dated Jul. 7, 2017 in International Patent Application No. PCT/US2017/018549, 22 Pages.

* cited by examiner

*Primary Examiner* — Connie Yoha
(74) *Attorney, Agent, or Firm* — Vierra Magen Marcus LLP

(57) ABSTRACT

A memory system includes blocks (or other groupings) of memory cells including data memory cells and dummy memory cells. In order to mitigate program disturb or other issues, the memory system applies a gate voltage based on temperature to all or a subset of the dummy memory cells as part of a memory operation.

18 Claims, 18 Drawing Sheets

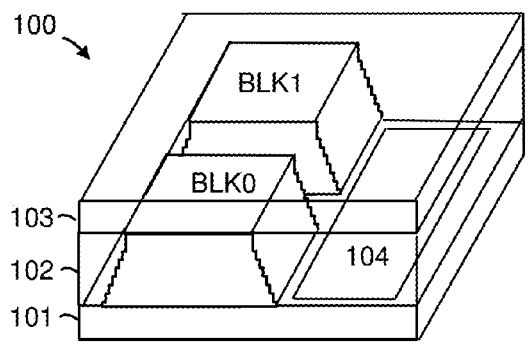
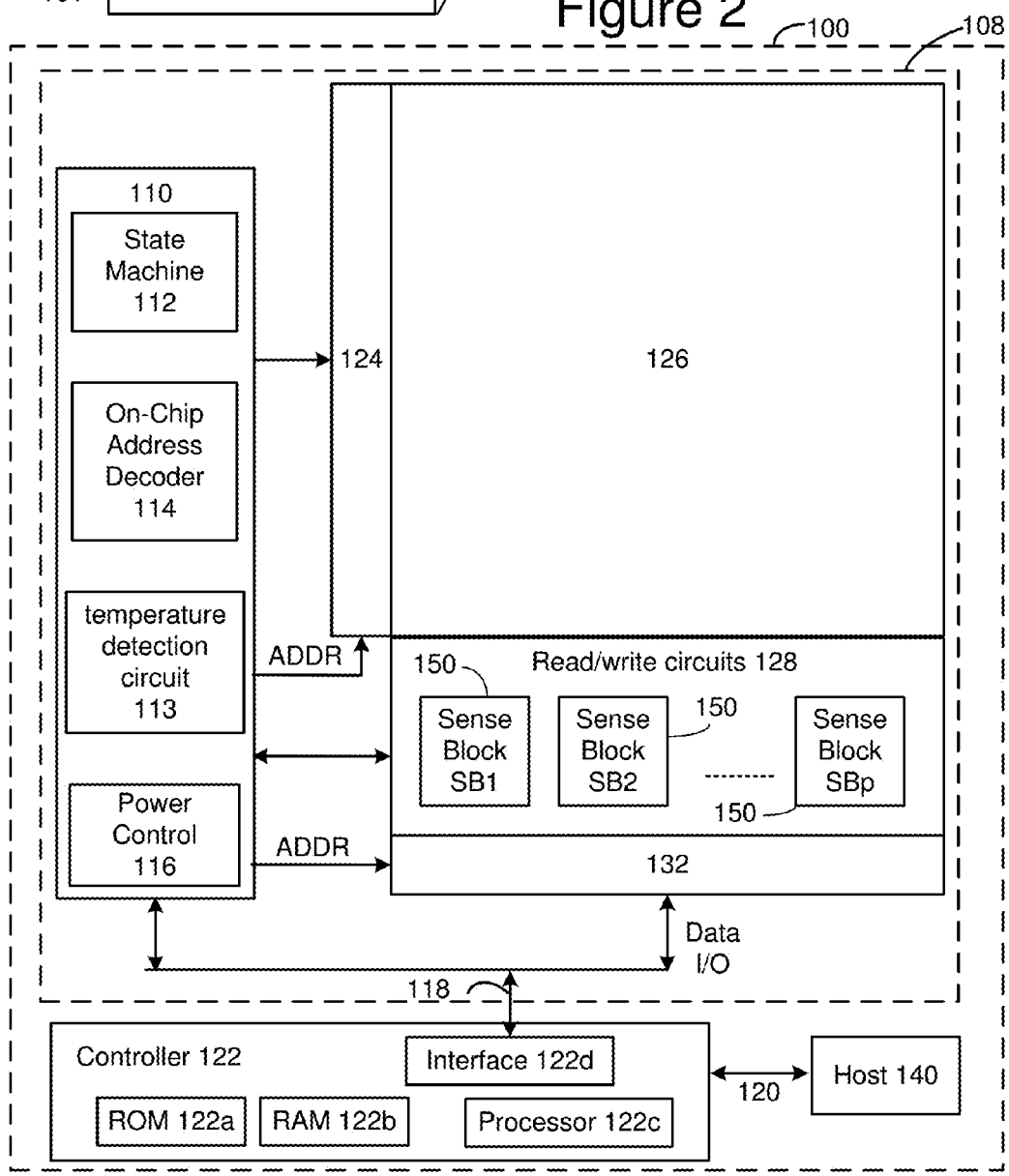

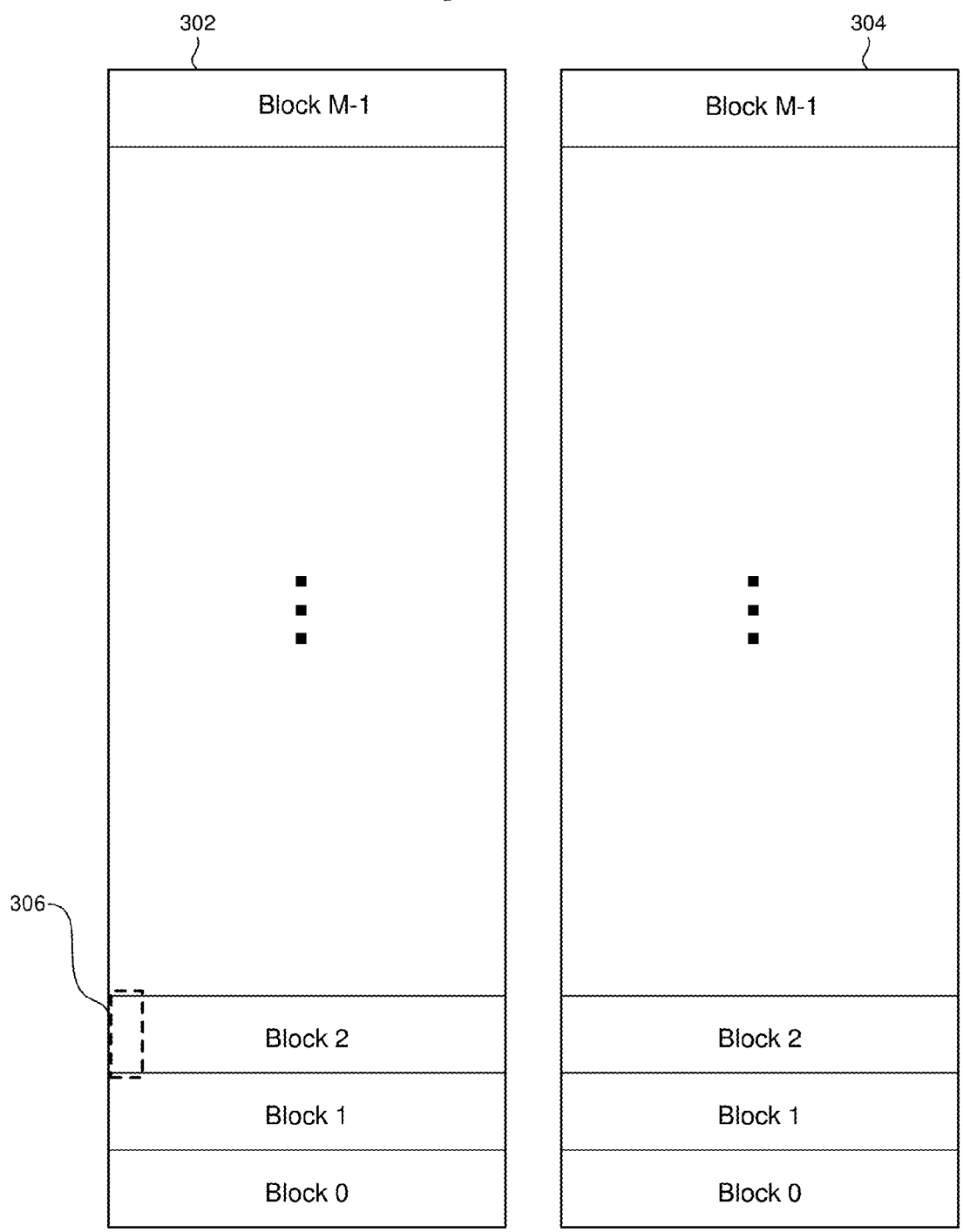

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

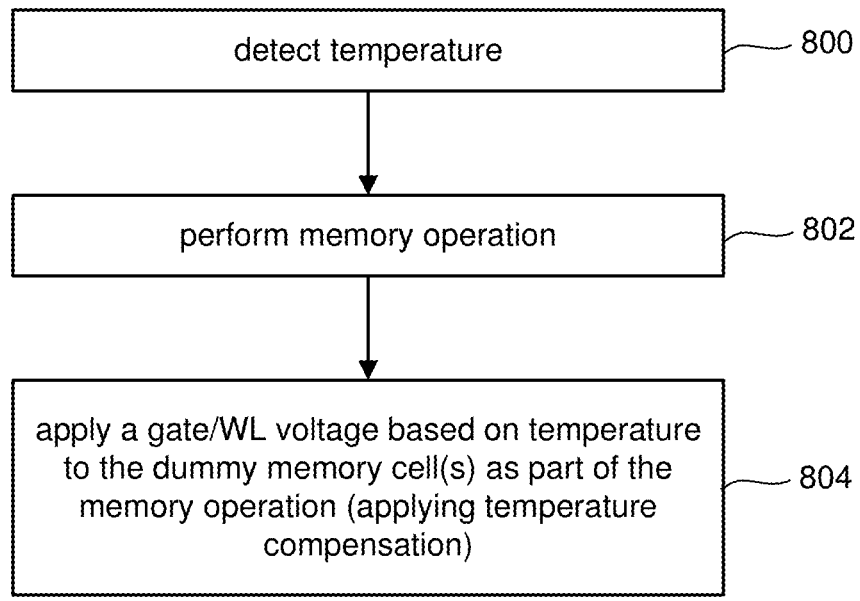
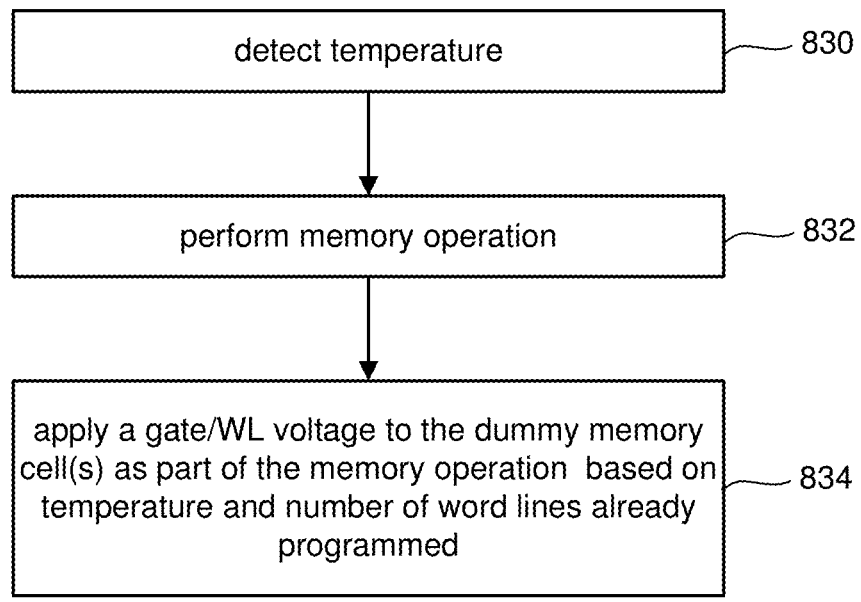

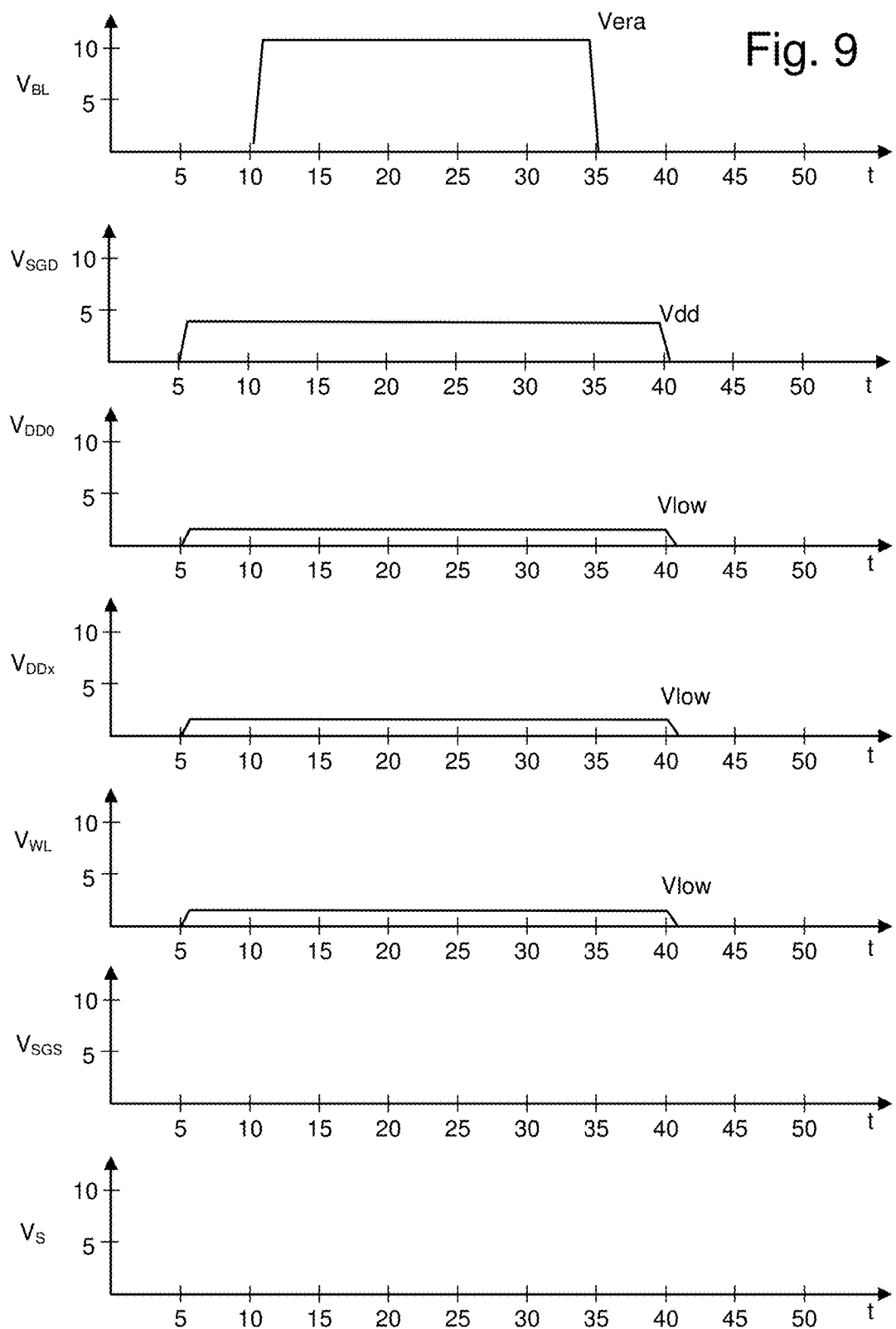

voltage adjustment Vcg_TCO temperature voltage adjustment Vcg_nwpro 0     46     # of word lines already programmed in block

DUMMY WORD LINE CONTROL SCHEME FOR NON-VOLATILE MEMORY

BACKGROUND

Semiconductor memory devices have become more popular for use in various electronic devices. For example, non-volatile semiconductor memory is used in cellular telephones, digital cameras, personal digital assistants, mobile computing devices, non-mobile computing devices and other devices.

In non-volatile semiconductor memory, data is stored in memory cells. Bit lines and word lines are used to connect to the memory cells. In some systems, the voltage used to program data into the memory cells (referred to as the program voltage) is applied to a selected word line and each word line is connected to many memory cells. Therefore, all memory cells connected to a word line may concurrently receive the program voltage. It is often the case, however, that then when performing programming not all memory cells connected to a word line will require programming. That means that the program voltage will be applied to memory cells to be programmed as well as memory cells that are not supposed to be programmed. These memory cells that are not supposed to be programmed should be inhibited from programming. However, because memory cells that should be inhibited from programming still receive the program voltage, it is possible these memory cells that should be inhibited from programming still experience some programming. This phenomenon is referred to as program disturb and, if severe enough, can lead to errors in the data being stored by the memory system.

BRIEF DESCRIPTION OF THE DRAWINGS

Like-numbered elements refer to common components in the different figures.

FIG. 1 is a perspective view of a 3D stacked non-volatile memory device.

FIG. 2 is a functional block diagram of a memory device such as the 3D stacked non-volatile memory device 100 of FIG. 1.

FIG. 4A is a block diagram of a memory structure having two planes.

FIG. 7 is a flow chart describing one embodiment of a process for performing memory operations on data memory cells including applying temperature compensation to at least a subset of dummy cells.

FIG. 8 is a flow chart describing one embodiment of a process for performing memory operations on data memory cells including applying temperature compensation to at least a subset of dummy cells.

FIG. 9 is a signal diagram depicting the behavior of various signals during an erase operation.

DETAILED DESCRIPTION

Figure 3:
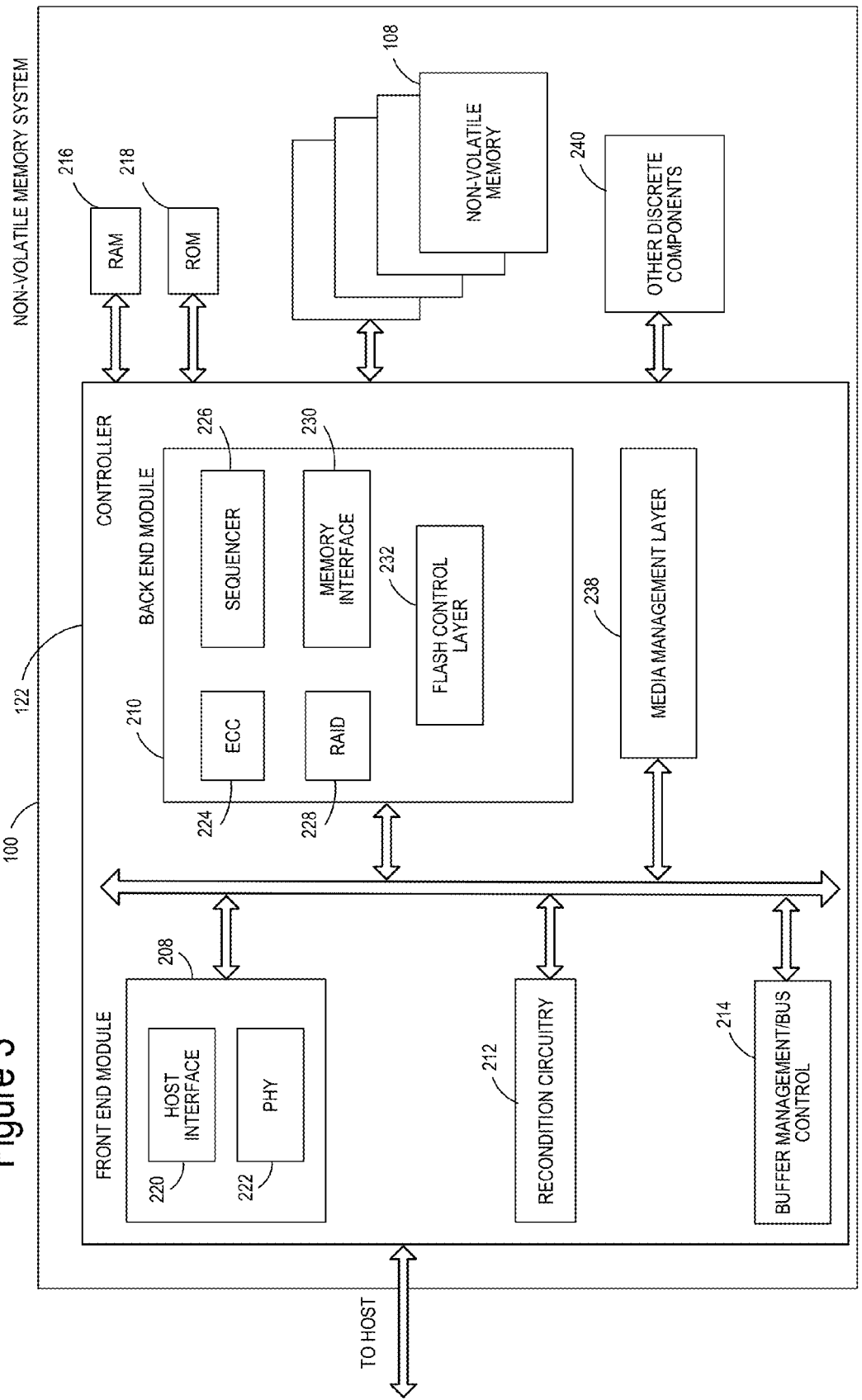
FIG. 3 is a block diagram depicting one embodiment of a Controller.

Technology is proposed to mitigate program disturb (and/or other issues). A memory system includes blocks (or other groupings) of memory cells including data memory cells and dummy memory cells. A data memory cell is eligible to store user data, which is also referred to as host data as the user/host data is provided to the memory system for storage by the host device that is in communication with the memory system. A dummy memory cell does not store user/host data. In order to mitigate program disturb or other issues, the memory system applies a gate voltage based on temperature to all or a subset of the dummy memory cells as part of a memory operation. In one example embodiment, dummy memory cells are connected to dummy word lines and the word line voltage applied to the dummy word line closest to the bit line contact (and closest to the drain side select gates and adjacent the last word line to be programmed) is adjusted based on temperature.

FIGS. 1-4F describe one example of a memory system that can be used to implement the technology proposed herein. FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits.

The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a Controller 122 is included in the same memory device 100 (e.g., a removable storage card) as the one or more memory die 108. However, in other systems, the Controller can be separated from the memory die 108. In some embodiments the Controller will be on a different die than the memory die. In some embodiments, one Controller 122 will communicate with multiple memory die 108. In other embodiments, each memory die 108 has its own Controller. Commands and data are transferred between the host 140 and Controller 122 via a data bus 120, and between Controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Temperature detection circuit 113 is configured to detect temperature, and can be any suitable temperature detection circuit known in the art. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, temperature detection circuit 113, power control module 116, sense blocks 150, read/write circuits 128, and Controller 122 can be considered one or more control circuits (or a managing circuit) that performs the functions described herein.

The (on-chip or off-chip) Controller 122 (which in one embodiment is an electrical circuit) may comprise a processor 122c, ROM 122a, RAM 122b and a Memory Interface 122d, all of which are interconnected. Processor 122C is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between Controller 122 and memory die 108. For example, memory interface 122d can change the format or timing of signals, provide a buffer, isolate from surges, latch I/O, etc. Processor 122C can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

FIG. 3 is a block diagram of example memory system 100, depicting more details of Controller 122. As used herein, a flash memory Controller is a device that manages data stored on flash memory and communicates with a host, such as a computer or electronic device. A flash memory Controller can have various functionality in addition to the specific functionality described herein. For example, the flash memory Controller can format the flash memory to ensure the memory is operating properly, map out bad flash memory cells, and allocate spare memory cells to be substituted for future failed cells. Some part of the spare cells can be used to hold firmware to operate the flash memory Controller and implement other features. In operation, when a host needs to read data from or write data to the flash memory, it will communicate with the flash memory Controller. If the host provides a logical address to which data is to be read/written, the flash memory Controller can convert the logical address received from the host to a physical address in the flash memory. (Alternatively, the host can provide the physical address). The flash memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between Controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between Controller 122 and non-volatile memory die 108, the subject matter described herein is not limited to having a single memory channel. For example, in some memory system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 3, Controller 112 includes a front end module 208 that interfaces with a host, a back end module 210 that interfaces with the one or more non-volatile memory die 108, and various other modules that perform functions which will now be described in detail.

The components of Controller 122 depicted in FIG. 3 may take the form of a packaged functional hardware unit (e.g., an electrical circuit) designed for use with other components, a portion of a program code (e.g., software or firmware) executable by a (micro)processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for Controller 122 to perform the functions described herein. The architecture depicted in FIG. 3 is one example implementation that may (or may not) use the components of Controller 122 depicted in FIG. 2 (i.e. RAM, ROM, processor, interface).

Controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the Controller 122, a buffer manager/bus Controller 214 manages buffers in random access memory (RAM) 216 and controls the internal bus arbitration of Controller 122. A read only memory (ROM) 218 stores system boot code. Although illustrated in FIG. 3 as located separately from the Controller 122, in other embodiments one or both of the RAM 216 and ROM 218 may be located within the Controller. In yet other embodiments, portions of RAM and ROM may be located both within the Controller 122 and outside the Controller. Further, in some implementations, the Controller 122, RAM 216, and ROM 218 may be located on separate semiconductor die.

Front end module 208 includes a host interface 220 and a physical layer interface (PHY) 222 that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction Controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, Controller 122 and multiple memory dies (together comprising non-volatile storage system 100) implement a solid state drive (SSD), which can emulate, replace or be used instead of a hard disk drive inside a host, as a NAS device, etc. Additionally, the SSD need not be made to work as a hard drive.

In one embodiment, as discussed below with respect to FIGS. 7-12B, Controller 122 determines candidate bad blocks to test for usability based on previously recorded error codes, causes testing of the candidate bad blocks for usability, and causes storage of information in candidate blocks determined to be still usable.

Figure 4:
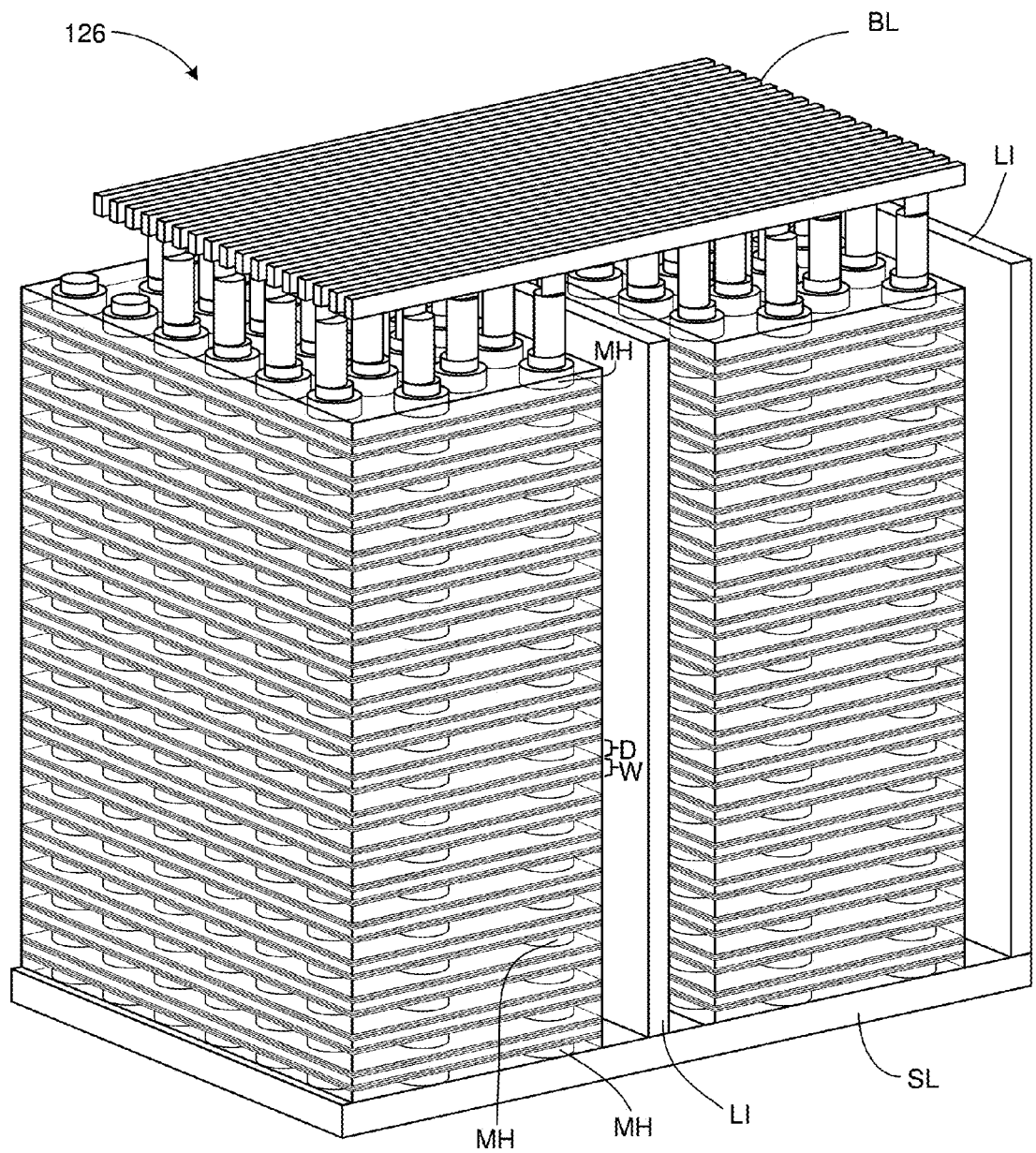
FIG. 4 is a perspective view of a portion of a three dimensional monolithic memory structure.

FIG. 4 is a perspective view of a portion of a three dimensional monolithic memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 is provided below with respect to FIG. 4A-4G.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
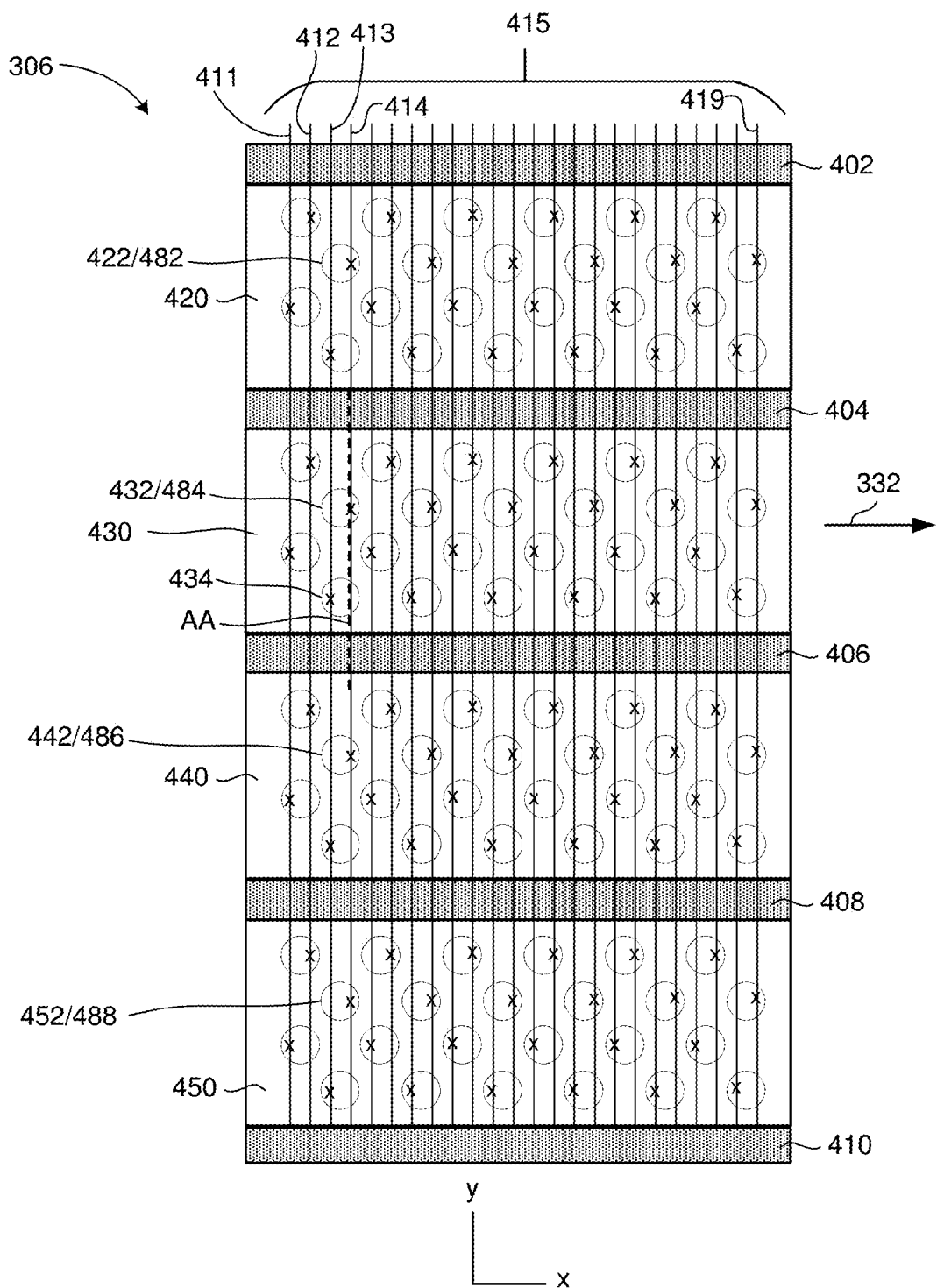
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
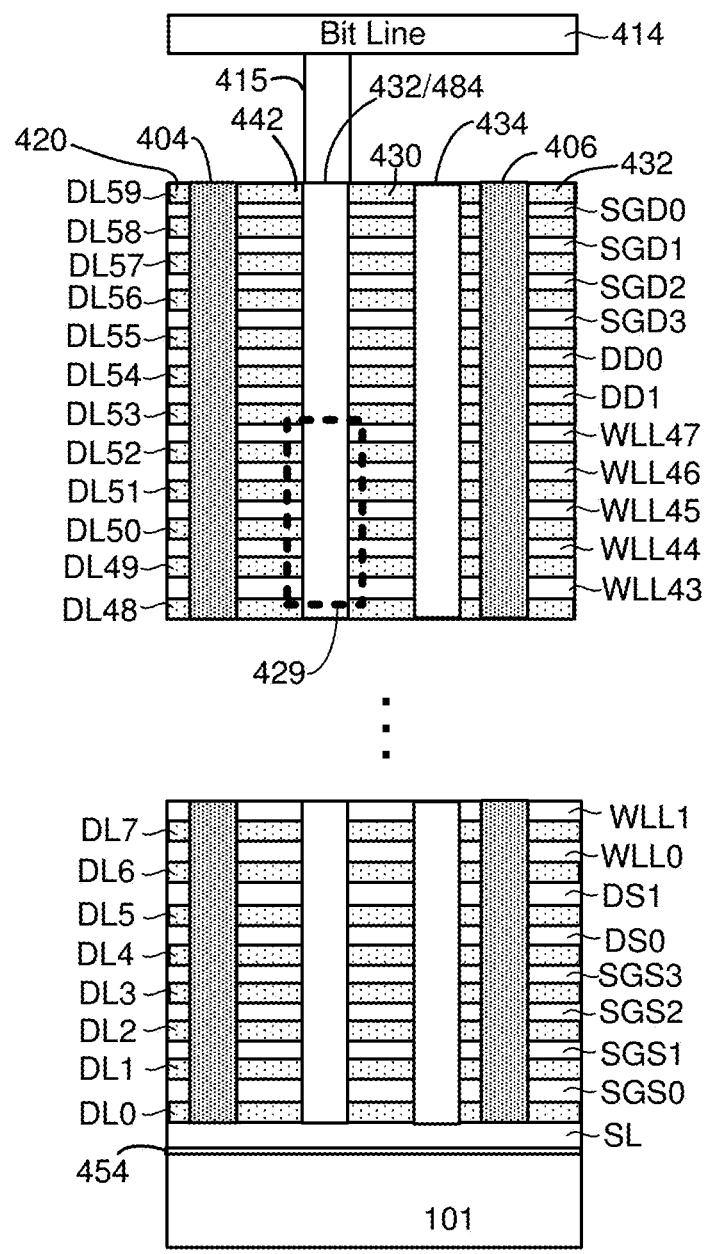
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

Figure 4D:
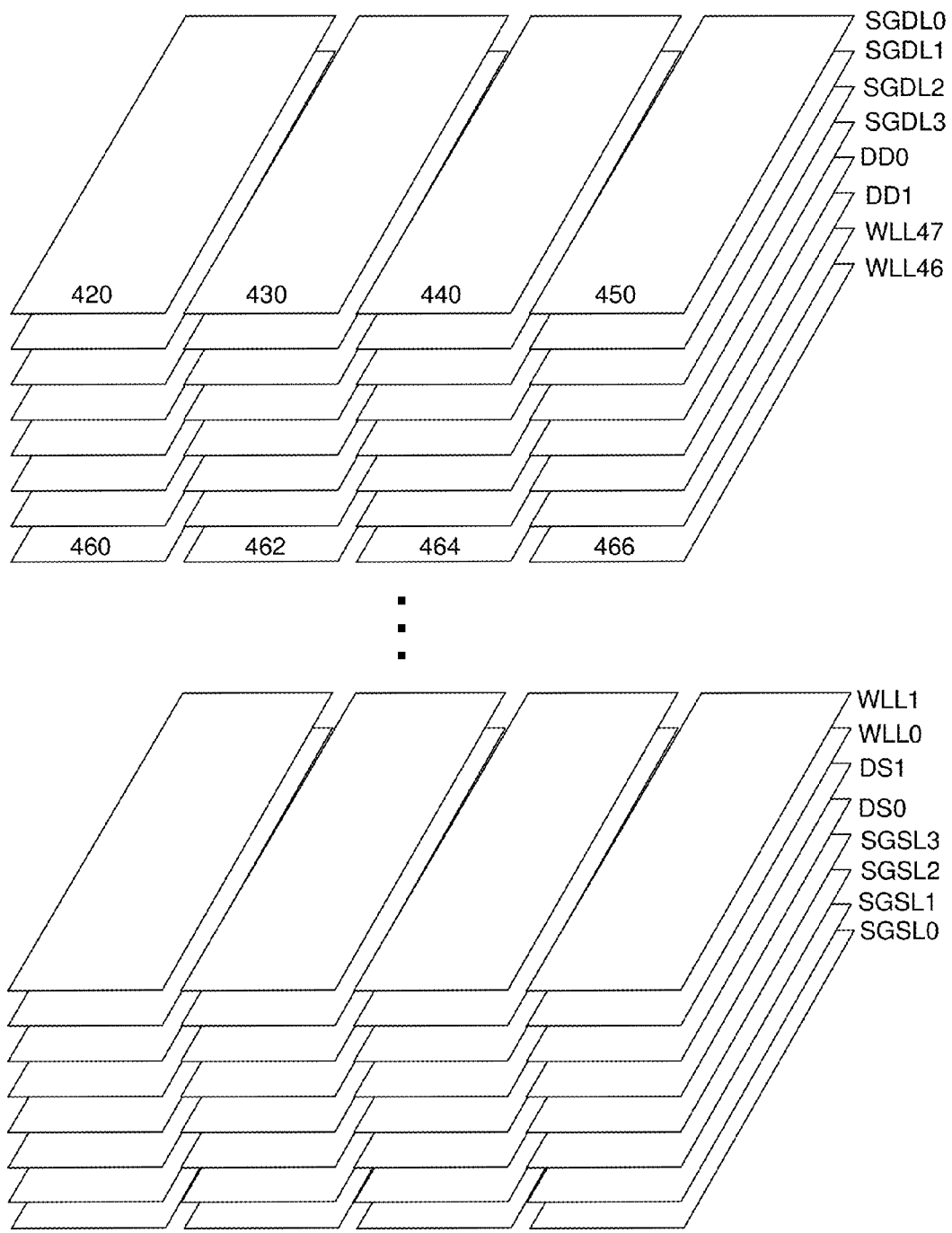
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment local interconnects 402, 404, 406, 408 and 410 break up each conductive layers into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
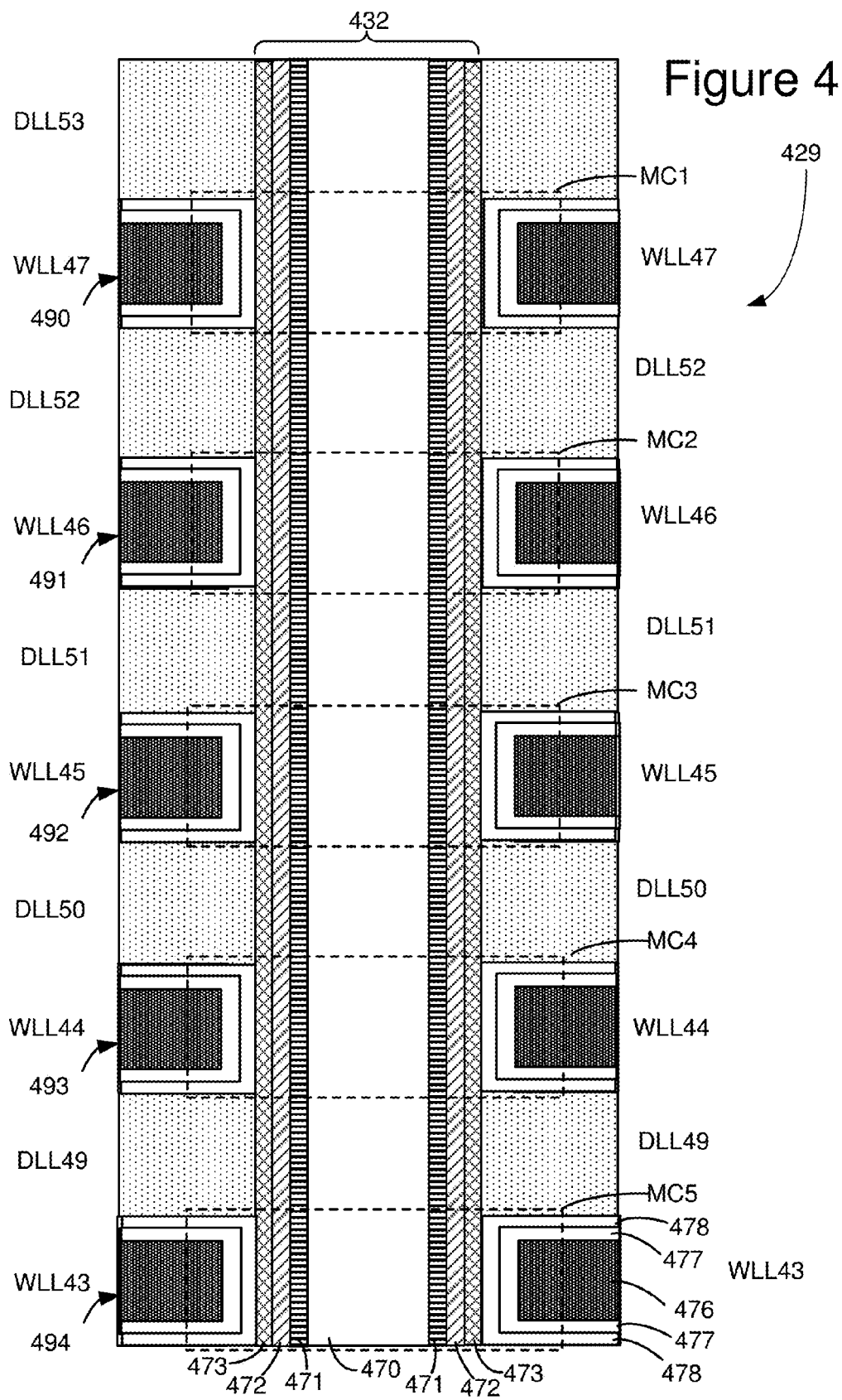
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
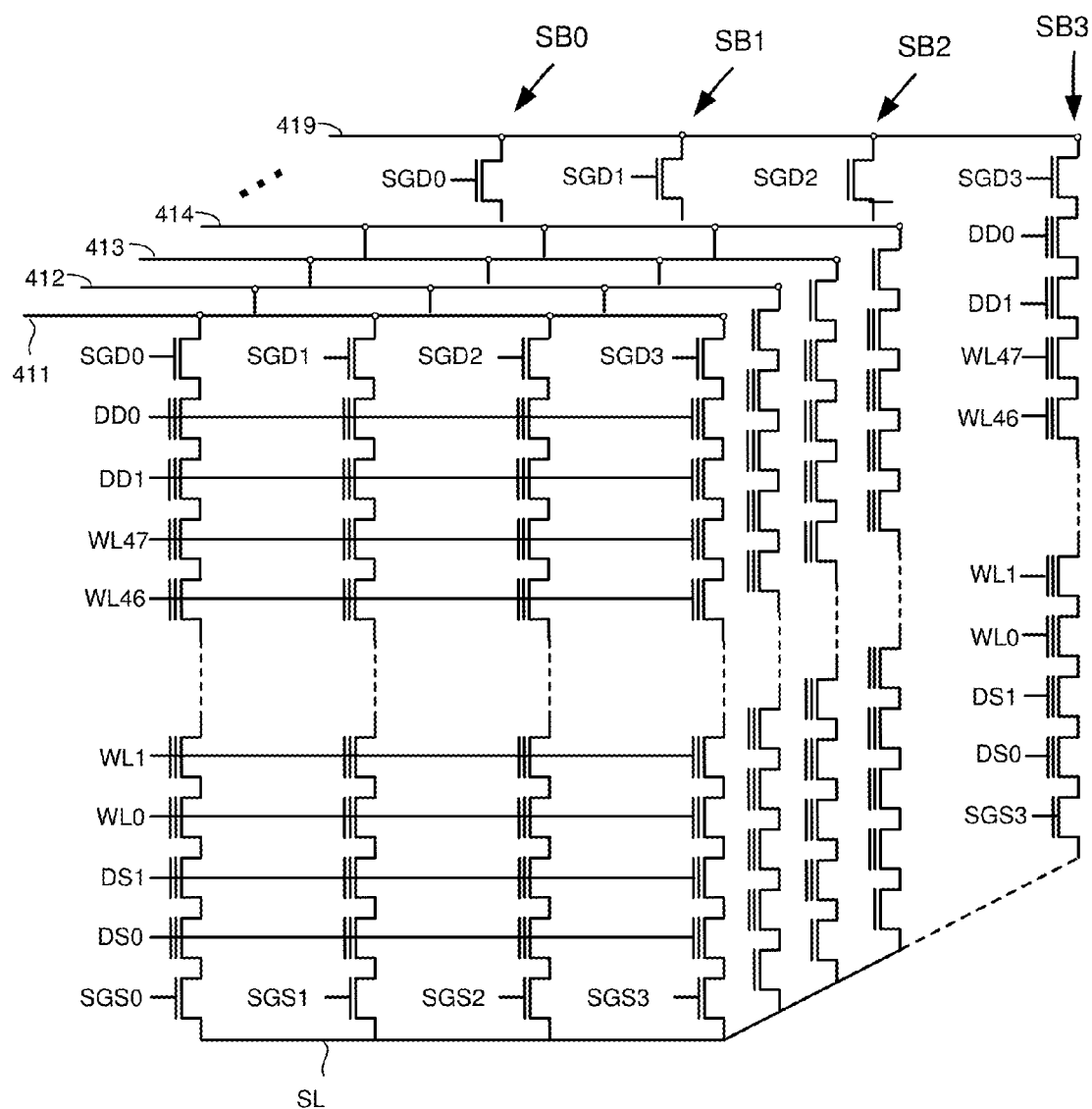
FIG. 4F is a schematic of a plurality of NAND strings.

FIG. 4F shows physical word lines WLL0-WLL47 running across the entire block. The structure of FIG. 4G corresponds to portion 306 in Block 2 of FIGS. 4A-F, including bit lines 411, 412, 413, 414, . . . 419. Within the block, each bit line connected to four NAND strings. Drain side select lines SGD0, SGD1, SGD2 and SGD3 are used to determine which of the four NAND strings connect to the associated bit line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 4-4F is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

Figures 5, 5A:
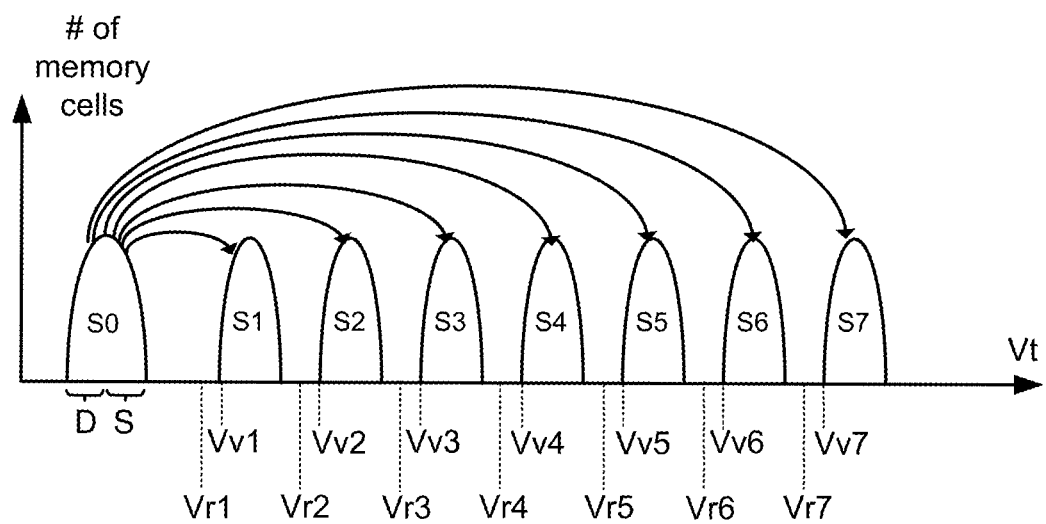
FIG. 5 depicts threshold voltage distributions.
FIG. 5A is a table describing one example of an assignment of data values to data states.

At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing whether the threshold voltage of a given memory cell is above or below the seven read reference voltages, the system can determine what data state (i.e., S0, S1, S2, S3, . . . ) the memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-D7 can overlap, with Controller 122 relying on ECC to identify the correct data being stored.

FIG. 5A is a table describing one example of an assignment of data values to data states. In the table of FIG. 5A, S0-111, S1=110, S2=200, S3=000, S4=010, S5=011, S6=001 and S7=101. Other encodings of data can also be used. No particular data encoding is required by the technology disclosed herein.

Figure 6A:
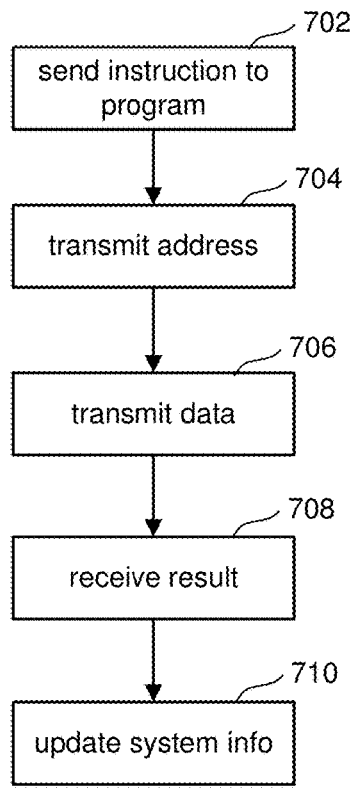
FIG. 6A is a flow chart describing one embodiment of a process for programming.

FIG. 6A is a flowchart describing one embodiment of a process for programming that is performed by Controller 122. In some embodiments, rather than have a dedicated Controller, the host can perform the functions of the Controller. In step 702, Controller 122 sends instructions to one or more memory die 108 to program data. In step 704, Controller 122 sends one or more logical addresses to one or more memory die 108. The one or more logical addresses indicate where to program the data. In step 706, Controller 122 sends the data to be programmed to the one or more memory die 108. In step 708, Controller 122 receives a result of the programming from the one or more memory die 108. Example results include that the data was programmed successfully, an indication that the programming operation failed, and indication that the data was programmed but at a different location, or other result. In step 710, in response to the result received in step 708, Controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, Controller 122 would receive user data and an instruction to program from the host, and the Controller would run the ECC engine to create code words from the user data. These code words are the data transmitted in step 706. Controller can also scramble the data to achieve wear leveling with respect to the memory cells.

Figure 6B:
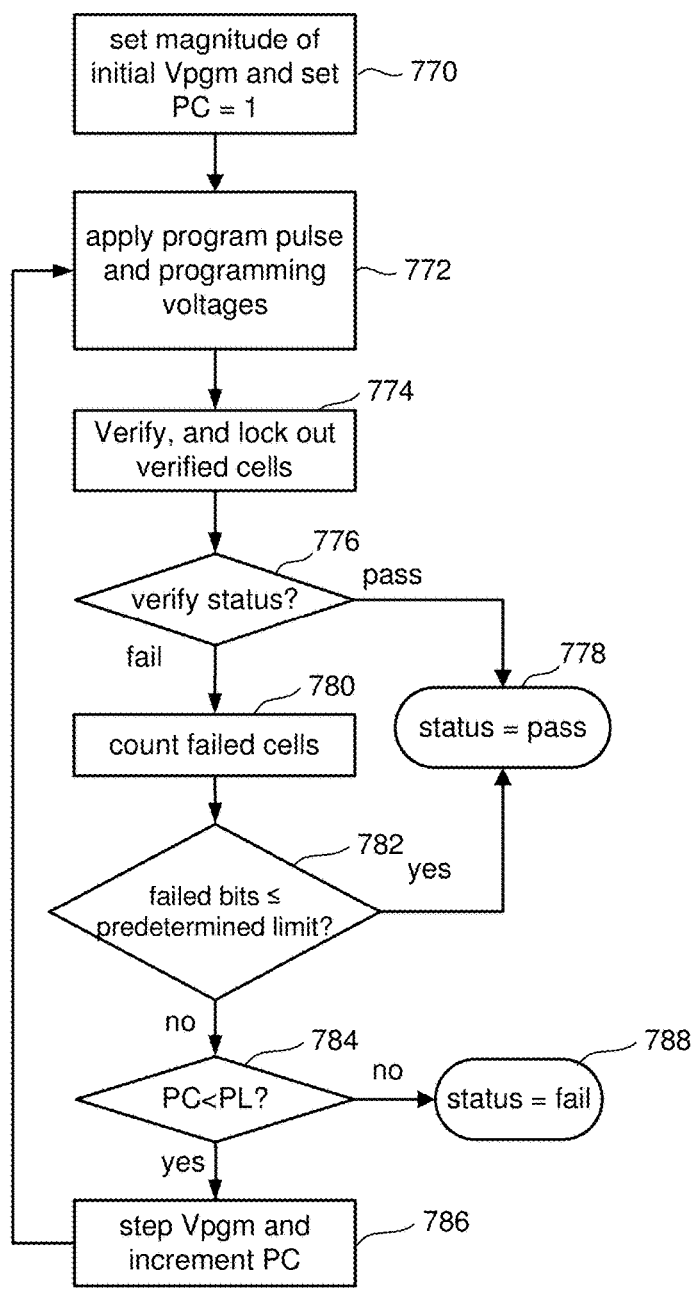
FIG. 6B is a flow chart describing one embodiment of a process for programming.

FIG. 6B is a flowchart describing one embodiment of a process for programming. The process of FIG. 6B is performed by the memory die in response to the steps of FIG. 6A (ie in response to the instructions, data and addresses from Controller 122). In one example embodiment, the process of FIG. 6B is performed on memory die 108 using the one or more control circuits discussed above, at the direction of state machine 112. The process of FIG. 6B can also be used to implement the full sequence programming discussed above. Additionally, the process of can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 6B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778.

If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the Controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not pre-determined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 20 and 30; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line.

In one embodiment, data is programmed in units of pages. So, for example, the process of FIG. 6B is used to program one page of data. Because it is possible that errors can occur when programming or reading, and errors can occur while storing data (e.g., due to electrons drifting, data retention issues or other phenomenon), error correction is used with the programming of a page of data. Many ECC coding schemes are well known in the art.

As discussed above, because memory cells that should be inhibited from programming still receive the program voltage at their control gate, it is possible that some of these memory cells that should be inhibited from programming still experience some change in threshold voltage. This phenomenon is referred to as program disturb and, if severe enough, can lead to errors in the data being store by the memory system. In order to mitigate program disturb or other issues, the memory system applies a gate voltage based on temperature to all or a subset of the dummy memory cells as part of a memory operation. For example, is has been found that program disturb is correlated to temperature of the environment that the memory system is located and to depth of erase of the dummy memory cells connected to dummy word line DD0. In other embodiments, the depth of erase of the dummy memory cells connected to dummy word lines other than DD0 can also have an effect on program disturb of data memory cells. At high temperatures, a shallow erase of the dummy memory cells reduces program disturb and results in a better failed bit count (ie number of errors when reading back the programmed data). At low temperatures, a deep erase of the dummy memory cells reduces program disturb and results in a better failed bit count. Looking back to FIG. 5, S0 represents the threshold voltage distribution for memory cells that are erased. A deep erased memory cell is in the lower half D of threshold voltage distribution S0 and a shallow erased memory cell is in the upper half S of threshold voltage distribution S0.

FIG. 7 is a flow chart describing one embodiment of a process for performing memory operations on the data memory cells, including applying temperature compensation to at least a subset of the dummy memory cells. The process of FIG. 7 is performed by any of the one or more control circuits described above with respect to FIGS. 2 and 3 in conjunction with the three dimensional memory structure of FIGS. 4-4F.

In step 800 of FIG. 7, the one or more control circuits detect temperature. For example, the temperature of the environment for which the memory system is located will be detected. In one embodiment, temperature detection circuit 113 is used to detect temperature and report that detected temperature to state machine 112. In one embodiment, temperature detection circuit 113 saves temperature information into a register which can be read by state machine 112, Controller 122 or other control circuitry 110. The many different suitable temperature detection circuits known in the art can be used, with no particular temperature detection circuit design required for the technology described herein. In step 802, the one or more control circuits perform a memory operation. In one embodiment, performing the memory operation includes changing the threshold voltage of non-volatile data memory cells, such as erasing or programming the memory cells. In one example, step 802 includes performing the processes of FIGS. 6A and 6B. In step 804, the one or more control circuits apply a gate (or word line) voltage based on temperature to one or more dummy memory cells as part of the memory operation. Thus, step 804 is performed concurrently or as part of the memory operation of step 802. Step 804 includes applying temperature compensation to one or more dummy memory cells. Looking back at FIG. 4F, in one example embodiment each NAND string includes four dummy memory cells and each block includes four dummy word lines (DS0, DS1, DD0, and DD1). In one embodiment, temperature compensation is only applied to dummy word line DD0 such that the temperature compensation is only applied to dummy memory cells connected to dummy word line DD0. In other embodiments, other dummy memory cells on other dummy word lines can receive temperature compensation in addition to or instead of those memory cells connected to dummy word line DD0. It is noted that dummy word line DD0 is the dummy word line closest to the drain side select lines (SGD0, SGD1, SGD2, and SGD3) and closest to the bit lines (and bit line contacts). Thus, in one embodiment, the temperature compensation is only provided to those dummy memory cells closest to the drain side select lines, for the particular one or more NAND strings under consideration.

There are many suitable techniques for providing temperature compensation. In one embodiment, the particular dummy word line is assigned a base gate voltage. Step 804 includes providing an adjustment to the base gate voltage. This adjustment can be referred to as a temperature coefficient or temperature compensation. For example, consider the equation:

$$Vcg = base\_gate\_voltage + Vcg\_TC0,$$

where:

Vcg is the voltage applied through the dummy word line DD0 to the control gates of the dummy memory cells connected to dummy word line DD0;

base_gate_voltage is the base gate voltage assigned to the dummy word line DD0; and Vcg_TC0 is the temperature coefficient or temperature compensation used to adjust base_gate_voltage.

In one embodiment, state machine 112 or power control 116 accesses a register which indicates the base_gate_voltage. In addition, state machine 112, or power control circuit 116 accesses another register indicating the temperature information detected in step 800, and uses that temperature information to access a look-up table or other data structure to determine the value of Vcg_TC0. In another embodiment, state machine 112, or power control circuit 116 uses the detected temperature in a formula to derive or calculate Vcg_TC0. In another embodiment, state machine 112 or power control circuit 116 uses the detected temperature to derive a customized base voltage (thus not using a separate Vcg_TC0) based on temperature.

In one embodiment of the step 804, the one or more control circuits are configured to apply a higher gate voltage to the dummy memory cells (or higher word line voltage to the dummy word line) in response to a higher temperature and apply a lower gate voltage to the dummy memory cells (or lower word line voltage to the dummy word line) in response to a lower temperature. For example, Vcg_TC0 can be a positive number for high temperatures and a negative number for low temperatures. Alternatively, Vcg_TC0 can be a high positive number for higher temperatures and a low positive number for lower temperatures. Alternatively, Vcg_TC0 can be a positive number for high temperatures and zero for low temperatures. In one example of implementation, the system uses a base temperature of 85° C. If temperature detection circuit 113 determines a temperature (step 800) that is greater than 85° C., then state machine 112 considers the temperature to be a higher temperature; otherwise, the temperature is assumed to be a lower temperature.

FIG. 8 is a flowchart describing one embodiment of a process of performing memory operations on the data memory cells, including applying temperature compensation to at least a subset of the dummy memory cells. The process of FIG. 8 is performed by any of the one or more control circuits described above with respect to FIGS. 2 and 3 in conjunction with the three-dimensional memory structure of FIGS. 4-4F. The process of FIG. 8 is an alternative embodiment to the process of FIG. 7.

In step 830, the one or more control circuits detect temperature, similar to step 800. In step 832, the one more control circuits perform a memory operation, similar to step 802. In step 834, the one or more control circuits will apply a gate voltage to the one or more dummy memory cells (applying a word line voltage to the dummy word line) as part of the memory operation of step 832 based on temperature and number of word lines already programmed. Looking back at FIG. 4F, one example block of memory cells includes 48 data word lines (WL0-WL47) and memory cells are programmed based on word line position such that memory cells connected to word line WL0 are programmed first, followed by memory cells connected to word line WL1, followed by memory cells connected to WL2, etc. In other implementations, other orders of programming can be performed. Typically, the process of FIG. 6V is used to program all or many memory cells connected to a common word line. In step 834, state machine 112 determines how many word lines have already received programmed in the block. Based on the number of word lines that have already received programming, the gate voltage applied to the dummy memory cells (or the word line voltage to the dummy word line) can be adjusted accordingly. For example, state machine 112 may use the following formula:

$$Vcg = base\_gate\_voltage + Vcg\_TC0 + Vcg\_nwpro,$$

where Vcg_nwpro is an adjustment to base_gate_voltage based on the number or word lines already programmed.

In one embodiment, if the number of word lines already programmed is low, then Vcg_nwpro is smaller and if the number of word lines programmed is a high number then Vcg_nwpro is a larger adjustment. In some embodiments, when the number of word lines already programmed is low, the adjustment can be 0, a small positive number, or a negative number, while when the number of word lines programmed is high then the adjustment can be a higher positive number.

In one embodiment, the compensation applied in step 804 is only applied to memory cells connected to dummy word line DD0. In other embodiments, other dummy memory cells connected to other dummy word lines can also receive the compensation applied in step 804.

Figure 13:
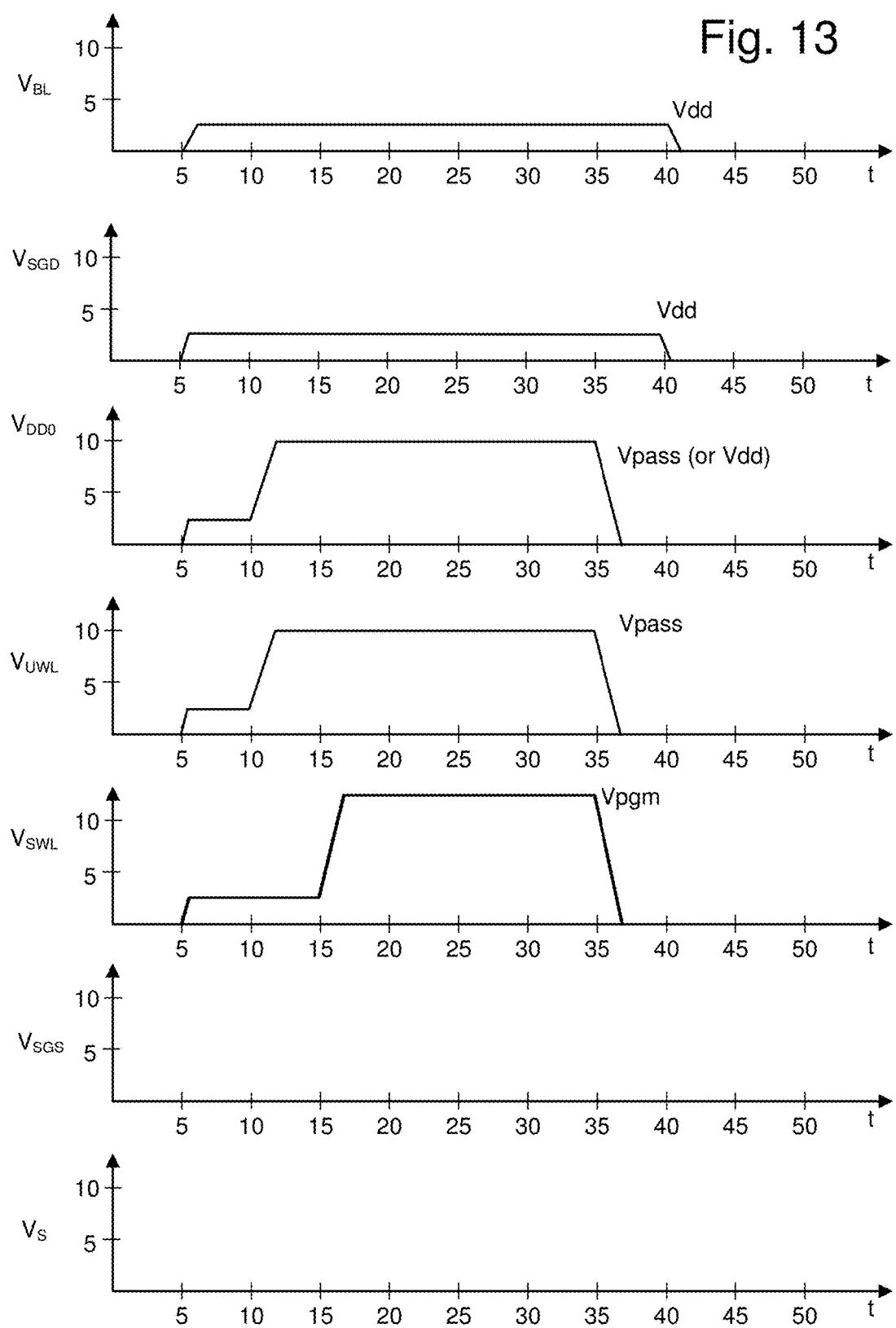
FIG. 13 is a signal diagram depicting the behavior of various signals during a programming operation.

Steps 802 and 832 include performing memory operations. In one embodiment, the memory operation performed is an erase operation. In another embodiment, the memory operation performed is a programming operation. FIG. 9 is a signal diagram depicting the behavior of various signals during one example of an erase operation. FIG. 13 is a signal diagram depicting the behavior of various signals during one example of a programming operation.

FIG. 9 depicts the behavior of the following signals: $V_{BL}$, $V_{SGD}$, $V_{DD0}$, $V_{DDx}$, $V_{WL}$, $V_{SGS}$, $V_S$. The signal $V_{BL}$ is the bit line voltage for a particular NAND string. In one embodiment, the entire block is a unit of erase such that all memory cells of the block will be erased concurrently. Therefore, every bit line will receive the same bit line signal. The signal $V_{SGDx}$ represents the voltage on each of the drain side select lines SGD0, SGD1, SGD2, and SDG3. In one embodiment, all four of the drain side select lines receive the same signal. The signal $V_{DD0}$ is the voltage on the dummy word line DD0. The $V_{DDx}$ is the voltage on each of the dummy word lines other than DD0, which includes DD1, DS0, DS1. The signal $V_{WL}$ is the voltage applied to all of the word lines of the block. The signal $V_{SGS}$ is the signal on the source side select lines including SGS0, SGS1, SGS2, and SGS3. The signal $V_S$ is the voltage on the source line. Each of the graphs depicted in FIG. 9 describe voltage over time. The graphs show time increments of 5, 10, 15, .... These times are arbitrary and are used only as a reference for indicating the behavior of the voltage signals. At time 5 $V_{SGDx}$ is raised to Vdd, $V_{DD0}$ is raised to Vlow, $V_{DDx}$ is raised to Vlow, and $V_{WL}$ is raised to Vlow. Throughout the timeframe depicted in FIG. 9, Vsgs and $V_S$ remain at ground. In one embodiment, Vdd is a voltage between 2.5 and 3.2 volts; however, other the voltage values can be used. In one embodiment, Vlow is a low voltage that is close to 0 volts; for example, Vlow can be equal to 0.6 volts or another value near 0 volts. In some embodiments, Vlow can be 0 volts. At time 10, an erase pulse is applied to the bit line; for example, FIG. 9 shows $V_{BL}$ being raised to Vera (approximately 20 volts) and then lowered to ground at time 35. At time 40, $V_{SGDx}$, $V_{DD0}$, $V_{DDx}$, and $V_{WL}$ are brought down to ground.

In one embodiment, the channel of an NAND string (memory hole) is charged up during an erase. In the embodiment of FIG. 9, the channel is charged by applying a high voltage to the bit line. The large erase pulse at Vera causes hole injection into the charge trapping layer via gate induced drain leakage. In an alternative embodiment, a high voltage can be applied to the source line $V_S$ to charge the channel.

FIG. 9 shows an erase operation that applies one erase pulse. In some embodiments, after an erase pulse is provided, the system will perform an erase verify to see whether all (or a sufficient number) of the memory cells are properly erased. If it is determined that not all memory cells are properly erased, then the operation depicted in FIG. 9 will be repeated and another verify performed until all memory cells are properly erased.

Figure 10:
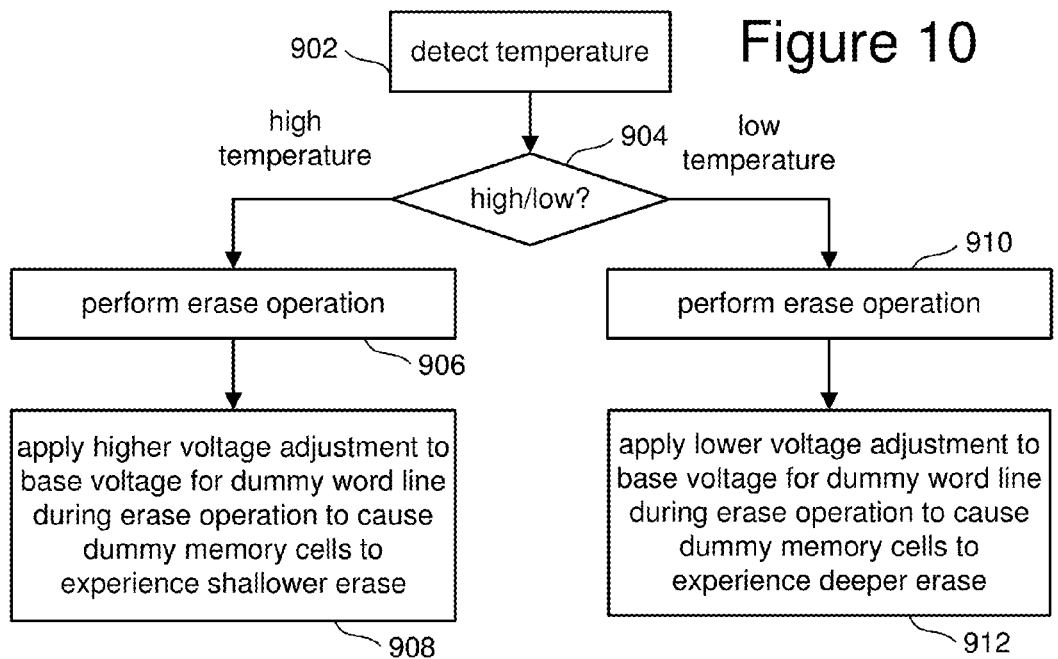
FIG. 10 is a flow chart describing one embodiment of a process for performing memory operations on data memory cells including applying temperature compensation to at least a subset of dummy cells.
Figure 11:
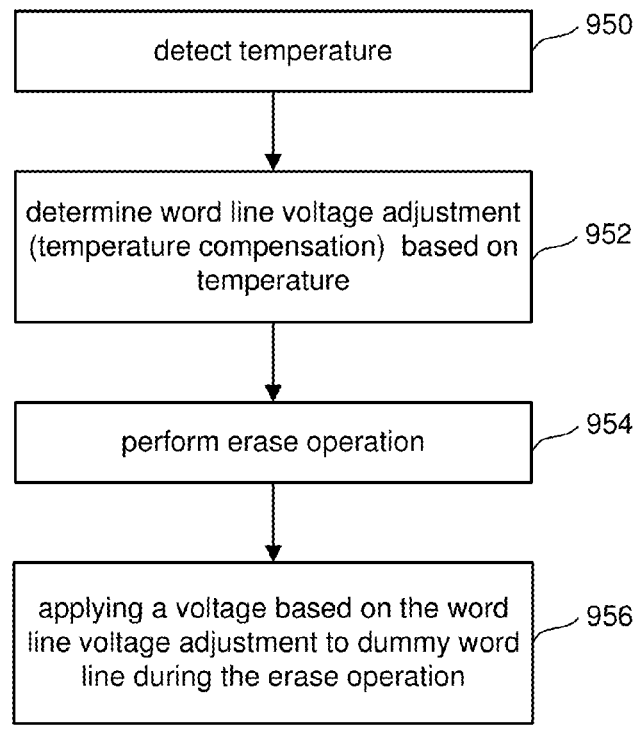
FIG. 11 is a flow chart describing one embodiment of a process for performing memory operations on data memory cells including applying temperature compensation to at least a subset of dummy cells.

The process of FIG. 9 provides an example of an erase operation without using temperature compensation. The voltage applied to the dummy word line DD0, indicated at FIG. 9 to be Vlow, is an example of the base_gate_voltage described above. Steps 804 or 834 will adjust this base_gate_voltage Vlow as described above. FIGS. 10 and 11 provide examples of adjusting the base_gate_voltage in order to provide temperature compensation.

FIG. 10 is a flow chart describing one embodiment of a process for performing memory operations on data memory cells, including applying temperature compensation to at least a subset of dummy memory cells. The process in FIG. 10 is one example implementation of the process of FIG. 7 when the memory operation being performed is an erase operation. The process of FIG. 10 is performed by any one of the one or more control circuits described above with respect to FIGS. 2 and 3 in conjunction with the three-dimensional memory structure FIGS. 4-4F.

In step 902 of FIG. 10, the one or more control circuits detect temperature (similar to step 800 of FIG. 7). In step 904, the one or more control circuits determine whether they have detected a high temperature or a low temperature. If a high temperature is detected, then the process continues to step 906. If a low temperature is detected, then the process continues to step 910. In step 906, an erase operation is performed. In step 908, the one or more control circuits apply a higher voltage adjustment to the base gate voltage for the dummy word line during the erase operation of step 906 in order to cause the dummy memory cells receiving the adjustment to experience a shallower erase. For example, a higher Vcg_TC0 can be applied to the base_gate_voltage for dummy word line DD0 during the erase operation of step 906 so that the dummy memory cells connected to dummy word line DD0 experience a shallow erase (e.g. upper half S of threshold voltage distribution S0 of FIG. 5). If a low temperature is detected (step 904), then in step 910 the one or more control circuits perform an erase operation. In step 912, the one or more control circuits apply a lower voltage adjustment to the base gate voltage for the dummy word line during the erase operation in step 910 in order to cause the dummy memory cells connected to that dummy word line to experience a deeper erase. For example, Vcg_TC0 will be a lower voltage adjustment to base_gate_voltage so that the dummy memory cells connected to dummy word line DD0 experience a deep erase (e.g. lower half D of threshold voltage distribution S0 of FIG. 5). When the erase operation of steps 906 or 910 is performed, the process depicted in FIG. 9 is performed with $V_{DD0}$ being equal to Vlow+Vcg_TC0.

FIG. 11 is a flow chart describing one embodiment of a process for performing memory operations on data memory cells, including applying temperature compensation to at least a subset of the dummy memory cells. The process of FIG. 11 is performed by any one or more of the control circuits described above with respect to FIGS. 2 and 3 in conjunction with the three-dimensional memory structure of FIGS. 4-4F. The process of FIG. 11 is one example implementation of the process of FIG. 7 when the memory operation being performed is an erase operation. FIG. 11 depicts an alternative embodiment to the process of FIG. 10.

In step 950 of FIG. 11, the one or more control circuits detect temperature (similar to step 800 of FIG. 7). In step 952, one or more control circuits determine a word line voltage adjustment based on temperature. This constitutes a temperature compensation. For example, step 952 includes determining Vcg_TC0 that will be applied to the base_gate_voltage. Alternatively, step 952 could include deriving, determining or otherwise generating a custom base voltage based on temperature. Step 954 includes performing an erase operation. In step 956, the one or more control circuits apply the word line voltage adjustment based on temperature from step 952 to the dummy word line during the erase operation of step 954. Thus, step 952 determines Vcg_TC0, which applied during step 956. When the erase operation of step 954 is performed, the process depicted in FIG. 9 is performed with $V_{DD0}$ being equal to Vlow+Vcg_TC0.

One difference between the process of FIG. 10 and the process of FIG. 11, is that the process of FIG. 10 determines whether the temperature is high or low and performs a set of steps for high temperatures and a set of steps for low temperatures. The process of FIG. 11 results in a temperature dependent voltage being generated at a higher resolution. That is FIG. 10 only looks at a binary situation of high temperature or low temperature while the process of FIG. 11 can compute a range of voltages based on a range of temperatures.

Figure 12A:
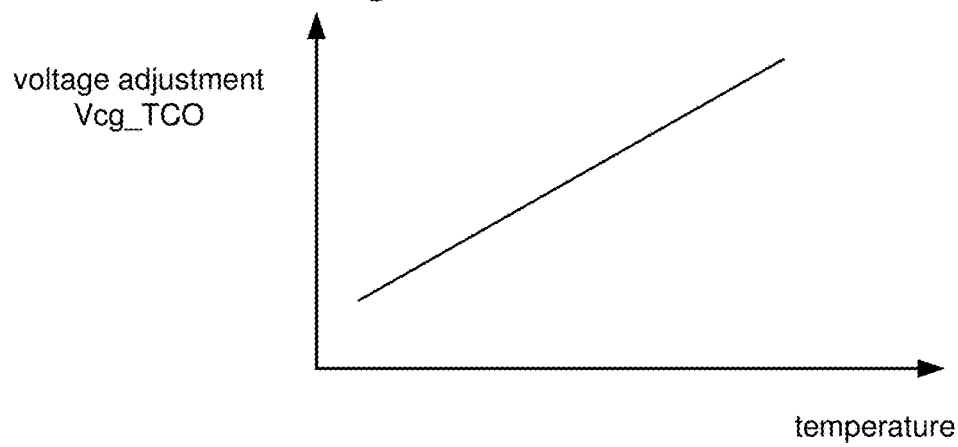
FIG. 12A is a graph of temperature versus voltage adjustment.
Figure 12B:
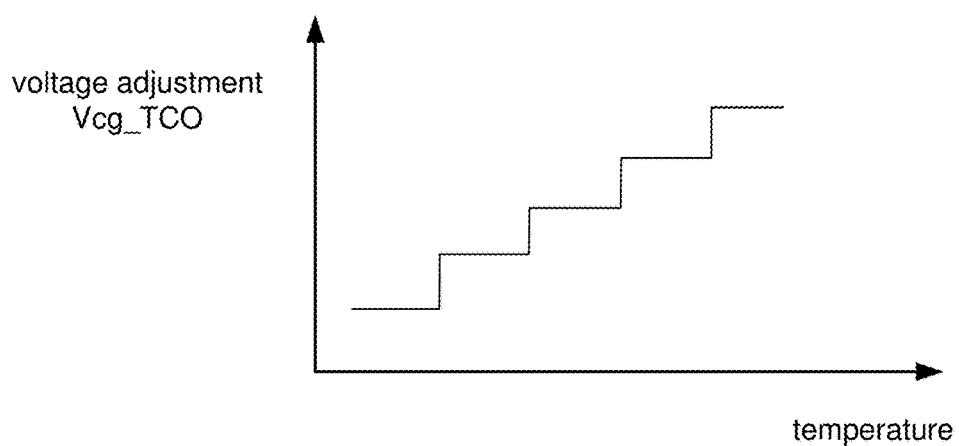
FIG. 12B is a graph of temperature versus voltage adjustment.
Figure 12C:
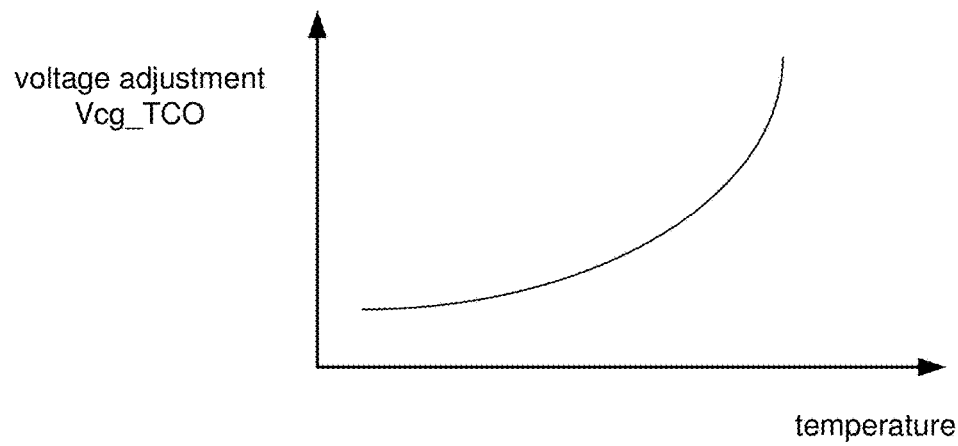
FIG. 12C is a graph of temperature versus voltage adjustment.

FIGS. 12A, 12B, and 12C provide examples that describe the determining of the word line voltage adjustment based on temperature (step 952). FIG. 12A is a graph of temperature versus voltage adjustment Vcg_TC0. In this example, Vcg_TC0 is a linear function of temperature, depicted as a straight line. As temperature rises, Vcg_TC0 also rises, with the voltage adjustment being modeled by the equation Vcg_TC0=mx+b, where x is the temperature, m is the slope of the line, and b is a zero crossing. FIG. 12B is a graph of temperature versus voltage adjustment Vcg_TC0. FIG. 12B shows the voltage adjustment Vcg_TC0 as a staircase/step function of temperature. As temperature rises, Vcg_TC0 rises in steps. FIG. 12c is a graph depicting temperature versus voltage adjustment Vcg_TC0, where Vcg_TC0 is a curve.

Looking back at FIGS. 7 and 8, steps 802 and 832 include performing a memory operation. Another example of the memory operation that can be performed is a programming operation. FIG. 13 is the signal diagram depicting the behavior of various signals during a programming operation. The signals depicted in FIG. 13 include $V_{BL}$, $V_{SGD}$, $V_{DD0}$, $V_{UWL}$, $V_{SWL}$, $V_{SGS}$, and $V_S$. The signal $V_{BL}$ is the bit line voltage for the bit line connected to the NAND string being programmed. Looking back at FIG. 4F, it was described that a block can be divided into four sub blocks: SB0, SB1, SB2, and SB3. Each bit line is connected to four NAND strings, one in each sub block. In one embodiment, the block is programmed only one sub block at a time. Therefore, three of the NAND strings connected to a bit line will be inhibited from programming based on turning off the appropriate drain side select gates. $V_{SGD}$ is the voltage at the drain side select line (connected to the drain side select gate) of the sub block that is selected for programming. Looking back at FIG. 4F, a block will have four drain side select lines: SDG0, SDG1, SDG2, and SDG3. One of those select lines will be selected for programming and the other three will be at ground to turn off the NAND strings in the non-selected sub blocks. The signal $V_{DD0}$ is the voltage applied to the dummy word line DD0. The signal $V_{UWL}$ is the voltage applied to all the data word lines (WL0-WL47) that are not selected for programming and the dummy word lines other than DD0. The signal $V_{SWL}$ is the voltage applied to the word line selected for programming $V_{SGS}$ is the voltage applied to all four source side select lines (SGS0, SGS1, SGS2, and SGS3). $V_S$ is the voltage applied to the source line.

In the time frame depicted in FIG. 13, $V_{SGS}$ and $V_S$ are at ground. Note that the units on the time scale are just for relative reference, and do not represent real time values. At time 5, the bit line voltage $V_{BL}$ and the source side select line voltage $V_{SGD}$ for the sub block selected for programming are both raised to Vdd. Additionally, $V_{DD0}$, $V_{UWL}$ and $V_{SW}$ are all raised to a pre-charge voltage. At time 10, the unselected word line voltage $V_{UWL}$ and the voltage on the first dummy word line $V_{DD0}$ are raised to Vpass (~7-8 volts) in order to boost the channels of unselected NAND strings. In some embodiments, $V_{DD0}$ is only raised to $V_{DD}$. At time 15, this selected word line voltage $V_{SWL}$ is raised to Vpgm which represents the program pulse that is applied in step 772 of FIG. 6B. At time 35, $V_{DD0}$, $V_{UWL}$, and $V_{SW}$ are brought down to ground. At time 40, $V_{BL}$ and $V_{SGD}$ are brought down to ground.

Figure 14:
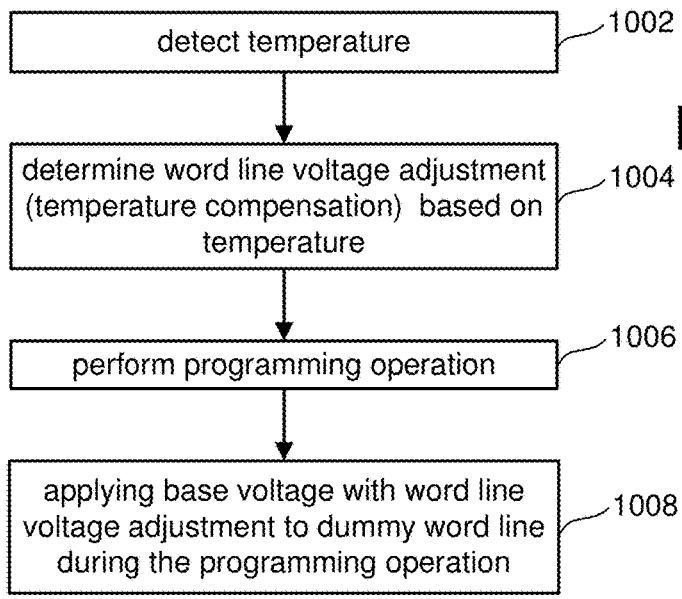
FIG. 14 is a flow chart describing one embodiment of a process for performing memory operations on data memory cells including applying temperature compensation to at least a subset of dummy cells.

FIG. 14 is a flow chart describing one embodiment of a process for performing memory operations on the data memory cells, including applying temperature compensation to at least a subset of the dummy memory cells. The process of FIG. 14 is performed by any of the one or more control circuits described above with respect to FIGS. 2 and 3 in conjunction with the three-dimensional memory structure of FIGS. 4-4F. FIG. 14 represents one example implementation of the process of FIG. 7 when the memory operation being performed is a programming operation, such as the programming operation of FIG. 13 with one or more of the dummy memory cells receiving temperature compensation as discussed below.

In step 1002, the one or more control circuits detect temperature (similar to step 800 in FIG. 7). In step 1006, the one or more control circuits perform a programming operation. In step 1008, the one or more control circuits apply a base voltage with a word line voltage adjustment to dummy word line DD0 (or another dummy word line) during the programming operation of step 1006. In one example, steps 1006 and 1008 include performing the process of FIG. 13, with $V_{DD0}$ receiving Vpass+Vcg_TC0. Thus, the process of FIG. 14 includes the one or more control circuits being configured to apply a lower gate voltage to dummy memory cells in response to a higher temperature (simulating shallow erase) and the one or more control circuits being configured to apply the higher voltage to the dummy memory cells in response to a lower temperature (simulating deeper erase). As discussed above, the adjusting the word line voltage can include using temperature to derive a custom base voltage or using temperature to derive an adjustment to the base voltage. For example, the one or more control circuits can be configured to add a lower temperature compensation to a base gate voltage for the dummy memory cells in response to detecting a higher temperature and add a higher temperature compensation voltage to a base gate voltage for the dummy memory cells in response to detecting a lower temperature. In one embodiment, in response to the higher temperature a negative adjustment is made to the base voltage and in response to a low temperature a positive adjustment is made to the base gate voltage. In another embodiment, both the lower temperature compensation voltage and the higher temperature voltage are both positive voltages or both negative voltages.

Figure 15:
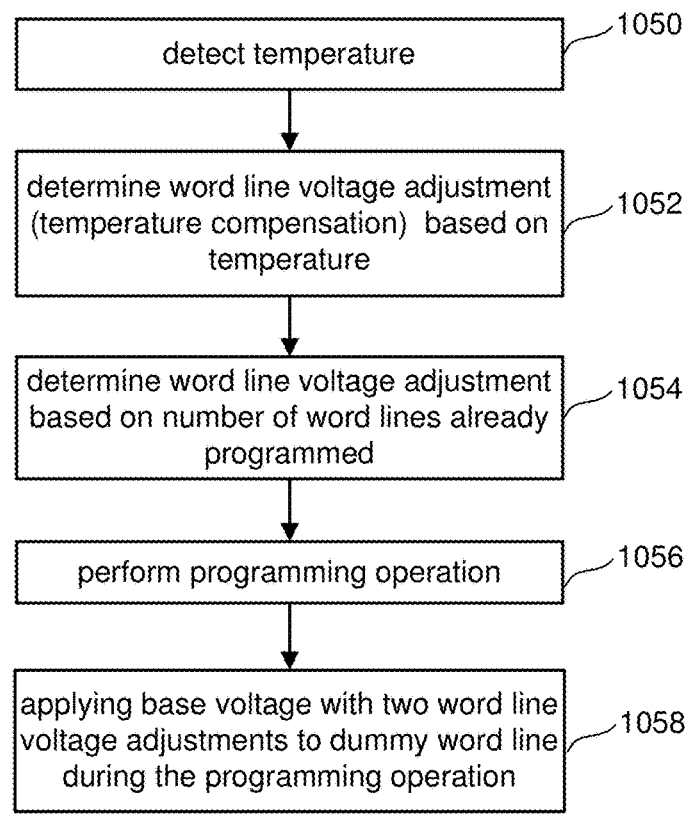
FIG. 15 is a flow chart describing one embodiment of a process for performing memory operations on data memory cells including applying temperature compensation to at least a subset of dummy cells.

FIG. 15 is a flow chart describing one embodiment of a process for performing memory operations on the data memory cells, including applying temperature compensation to at least a subset of the dummy memory cells. The process of FIG. 15 performed by any of the one or more control circuits described above with respect to FIGS. 2 and 3 in conjunction with the three-dimensional memory structure of FIGS. 4-4F. The process of FIG. 15 is example implementation of FIG. 8 when the memory operation being performed in the programming operation.

In step 1050 of FIG. 15, the one or more control circuits detect temperature (similar to step 800 of FIG. 7). In step 1052, the one or more control circuits determine a word line voltage adjustment based on temperature (similar to step 1004 of FIG. 14). In step 1054, the one or more control circuits determine a word line voltage adjustment based on the number of word lines already programmed. Thus, there are two word line voltage adjustments generated in the process of FIG. 15: a first adjustment is generated in step 1052 and a second adjustment is generated in step 1054. In step 1056, the one or more control circuits perform a programming operation. In step 1058, the one or more control circuits apply the base voltage to the dummy word line (e.g. DD0) with the base voltage being adjusted by the two word line voltage adjustments (from steps 1052 and 1054) during the programming operation of step 1056. For example, the one or more control circuits are configured to apply a higher gate voltage to the dummy memory cells if more than a predetermined number of word lines of the block are programmed and a lower temperature is detected, and apply a lower gate voltage to the dummy memory cells if less than a predetermined number of word lines of the block are programmed and a higher temperature is detected. Because FIG. 15 includes determining two adjustments, the base gate voltage can be adjusted twice in the same or separate directions. For example, the one or more control circuits are configured to increase the gate voltage to the dummy memory cells if more than a predetermined number of word lines in the block are programmed, the one or more control signals are configured to increase the gate voltage to the dummy memory cells if a lower temperature is detected, the one or more control circuits are configured to lower the gate voltage to the dummy memory cells if less than the predetermined number of word lines of the block are programmed and the one or more control signals are configured to lower the gate voltage to the dummy memory cells if a higher temperature is detected.

Figure 16:
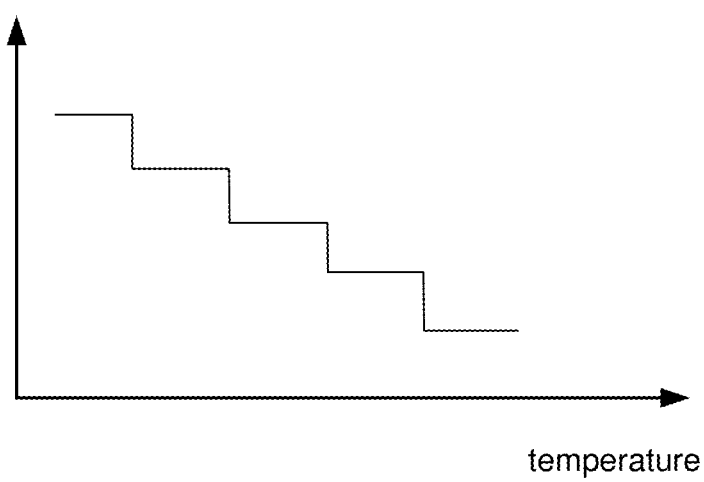
FIG. 16 is a graph of temperature versus voltage adjustment.

FIG. 16 is a graph temperature versus voltage adjustment Vcg_TC0. As temperature increases, Vcg_TC0 decreases. In one embodiment depicted in FIG. 16, Vcg_TC0 is a staircase/step function that lowers as temperature increases. In other embodiments, Vcg_TC0 can be a straight line or curve. FIG. 16 depicts how the word line voltage adjustment is determined in step 1052 based on temperature.

Figure 17:
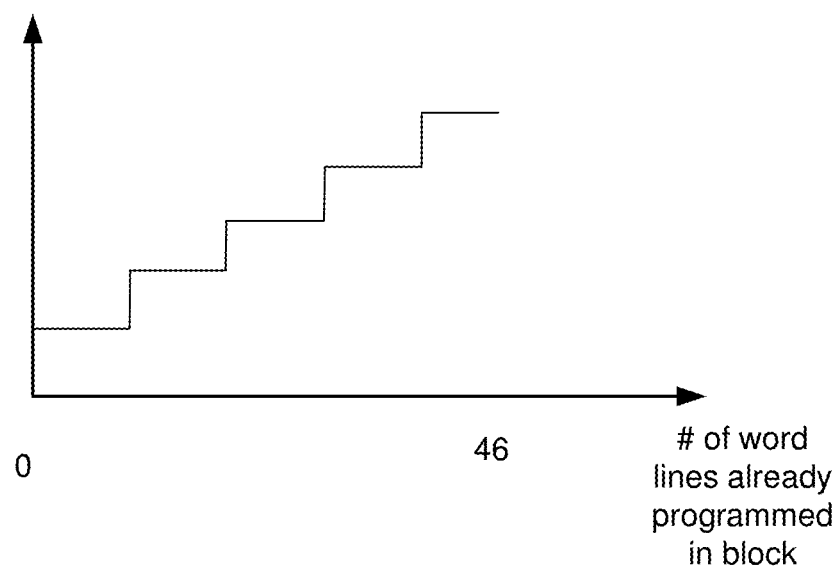
FIG. 17 is a graph of number of word lines programmed versus voltage adjustment.

FIG. 17 is a graph of the number of word lines already programmed in a block versus voltage adjustment Vcg_nwpro. As the number of word lines already programmed in the block increases, the voltage adjustment Vcg_nwpro also increases. In one embodiment, as depicted in FIG. 17, Vcg_nwpro increases as a staircase/step function. In other embodiments, Vcg_nwpro can be a straight line or a curve. FIG. 17 describes one embodiment for determining the word line voltage adjustment based on the number of word lines already programmed in step 1054.

One embodiment includes a non-volatile storage apparatus, comprising: a plurality of non-volatile memory cells including a data memory cell and a dummy memory cell; and one or more control circuits in communication with the plurality of non-volatile memory cells, the one or more control circuits configured to perform a memory operation on the data memory cell, the one or more control circuits configured to apply a gate voltage based on temperature to the dummy memory cell as part of the memory operation.

In one example implementation, the data memory cell and the dummy memory cell form a monolithic three dimensional memory structure and are part of a common NAND string; therefore, they share a common channel region. Additionally, in this example implementation, the NAND string includes a select gate, the plurality of non-volatile memory cells includes additional dummy memory cells on the NAND string, and the dummy memory cell is the closest dummy memory cell to the select gate.

One embodiment includes a method for operating non-volatile storage, comprising: changing threshold voltage of non-volatile data memory cells connected to a first word line; determining a word line voltage adjustment based on temperature; and applying a voltage based on the word line voltage adjustment to a dummy word line connected to dummy memory cells during the changing threshold voltage of the data memory cells connected to the first word line.

One embodiment includes a non-volatile storage apparatus, comprising: a three dimensional memory structure comprising: a plurality of non-volatile data memory cells each having a charge trapping layer, a plurality of non-volatile dummy memory cells, word lines including a data word line and a dummy word line, and bit lines; and one or more control circuits in communication with the three dimensional memory structure, the one or more control circuits configured to perform an operation on a group of the data memory cells connected to the data word line including applying a word line voltage based on temperature to the dummy word line, the dummy word line is connected to a group of the dummy memory cells.

One embodiment includes a non-volatile storage apparatus, comprising: a plurality of non-volatile memory cells organized into blocks, each block including data memory cells and dummy memory cells; and means for performing memory operations on the data memory cells including applying temperature compensation to at least a subset of the dummy cells.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
a plurality of non-volatile memory cells including a data memory cell and a dummy memory cell, wherein the data memory cell and the dummy memory cell are part of a common NAND string;
a select gate, wherein the select gate is part of the common NAND string and the dummy memory cell is located on the common NAND string between the data memory cell and the select gate; and
one or more control circuits in communication with the plurality of non-volatile memory cells, the one or more control circuits configured to perform a memory operation on the data memory cell, the one or more control circuits configured to apply a gate voltage based on temperature to the dummy memory cell as part of the memory operation, wherein:
the memory operation is an erase operation; and
the one or more control circuits are configured to apply the gate voltage based on temperature to the dummy memory cell as part of the memory operation to cause the dummy memory cell to experience a shallow erase in response to a higher temperature and to cause the dummy memory cell to experience a deeper erase in response to a lower temperature.

2. The non-volatile storage apparatus of claim 1, wherein:
the one or more control circuits are configured to apply a higher gate voltage to the dummy memory cell in response to a higher temperature; and the one or more control circuits are configured to apply a lower gate voltage to the dummy memory cell in response to a lower temperature.

3. The non-volatile storage apparatus of claim 1, wherein:
the one or more control circuits include a temperature detection circuit configured to detect temperature; and
the one or more control circuits are configured to add a temperature compensation voltage to a base gate voltage for the dummy memory cell in response to a detected higher temperature and
the one or more control circuits are configured to apply the base gate voltage to the dummy memory cell in response to a detected lower temperature.

4. The non-volatile storage apparatus of claim 1, wherein:
the one or more control circuits are configured to detect temperature; and
the one or more control circuits are configured to add a higher temperature compensation voltage to a base gate voltage for the dummy memory cell in response to a detected higher temperature; and
the one or more control circuits are configured to add a lower temperature compensation voltage to a base gate voltage for the dummy memory cell in response to a detected lower temperature.

5. A non-volatile storage apparatus, comprising:
a plurality of non-volatile memory cells including a data memory cell and a dummy memory cell, wherein the data memory cell and the dummy memory cell are part of a common NAND string;
a select gate, wherein the select gate is part of the common NAND string and the dummy memory cell is located on the common NAND string between the data memory cell and the select gate; and
one or more control circuits in communication with the plurality of non-volatile memory cells, the one or more control circuits configured to perform a memory operation on the data memory cell, the one or more control circuits configured to apply a gate voltage based on temperature to the dummy memory cell as part of the memory operation, wherein:
the one or more control circuits configured to apply the gate voltage to the dummy memory cell as part of the memory operation based on temperature and number of word lines already programmed;
the memory operation is a programming operation for the data memory cell;
the data memory cell and the dummy memory cell are in a block;
the one or more control circuits are configured to apply a higher gate voltage to the dummy memory cell if more than a predetermined number of word lines of the block are programmed; and
the one or more control circuits are configured to apply a lower gate voltage to the dummy memory cell if less than the predetermined number of word lines of the block are programmed.

6. The non-volatile storage apparatus of claim 5, wherein:
the one or more control circuits are configured to detect temperature;
the one or more control circuits are configured to apply a higher gate voltage to the dummy memory cell if a lower temperature is detected; and
the one or more control circuits are configured to apply a lower gate voltage to the dummy memory cell if a higher temperature is detected.

7. The non-volatile storage apparatus of claim 5, wherein:
the one or more control circuits are configured to detect temperature;
the one or more control circuits are configured to increase gate voltage to the dummy memory cell if a lower temperature is detected; and
the one or more control circuits are configured to lower gate voltage to the dummy memory cell if a higher temperature is detected.

8. The non-volatile storage apparatus of claim 1, wherein:
the data memory cell and the dummy memory cell share a common channel region.

9. The non-volatile storage apparatus of claim 1, wherein:
the plurality of non-volatile memory cells includes additional dummy memory cells on the common NAND string, with the dummy memory cell being a closest dummy memory cell to the select gate.

10. The non-volatile storage apparatus of claim 1, wherein:
the plurality of non-volatile memory cells form a monolithic three dimensional memory structure.

11. A method for operating non-volatile storage, comprising:
changing threshold voltage of non-volatile data memory cells connected to a first word line;
determining a word line voltage adjustment based on temperature; and
applying a voltage based on the word line voltage adjustment to a dummy word line connected to dummy memory cells during the changing threshold voltage of the data memory cells connected to the first word line, wherein the data memory cells and the dummy memory cells are arranged as one or more NAND strings, in each of which one of the dummy memory cells is located between one of the data memory cells and a select gate, wherein:
the data memory cells, the dummy memory cells, the first word line and the dummy word line are in a block;
the dummy word line is adjacent a select line for the block;
the changing threshold voltage includes erasing the block; and
the applying the voltage based on the word line voltage adjustment to the dummy word line includes applying a higher voltage to the dummy word line in response to a detected higher temperature and applying a lower voltage to the dummy word line in response to a detected lower temperature.

12. The method of claim 11, wherein:
the applying the voltage based on the word line voltage adjustment to the dummy word line includes causing the dummy memory cells to experience a shallow erase in response to a detected higher temperature and to causing the dummy memory cells to experience a deeper erase in response to a detected lower temperature.

13. The method of claim 11, wherein:
the changing threshold voltage includes programming the data memory cells; and
the applying the voltage based on the word line voltage adjustment to the dummy word line includes applying a lower voltage to the dummy word line in response to a higher temperature and applying a higher voltage to the dummy word line in response to a lower temperature.

14. The method of claim 11, further comprising:
determining an additional adjustment based on number of word lines in a block already programmed; and applying the additional adjustment to the dummy word line during the changing threshold voltage of the data memory cells connected to the first word line.

15. The method of claim 11, wherein:
each of the data memory cells is connected to one of the dummy memory cells.

16. The non-volatile storage apparatus of claim 5, wherein:
the data memory cell and the dummy memory cell share a common channel region.

17. The non-volatile storage apparatus of claim 5, wherein:
the plurality of non-volatile memory cells includes additional dummy memory cells on the common NAND string, with the dummy memory cell being a closest dummy memory cell to the select gate.

18. The non-volatile storage apparatus of claim 5, wherein:
the plurality of non-volatile memory cells form a monolithic three dimensional memory structure.

* * * * *